（12） United States Patent
Li (10) Patent No.: US 6,747,359 B1
(45) Date of Patent: Jun. 8, 2004

(54) RESIDUE-FREE CONTACT OPENINGS AND METHODS FOR FABRICATING SAME

(75) Inventor: Li Li, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/648,696

(22) Filed: Aug. 25, 2000

Related U.S. Application Data

(62) Division of application No. 09/035,497, filed on Mar. 5, 1998, now Pat. No. 6,576,547.

(51) Int. Cl.[7] .......................... H01L 23/52; H01L 29/40; H01L 21/44
(52) U.S. Cl. ...................... 257/765; 257/758; 257/759; 257/760; 438/688
(58) Field of Search .................. 257/758–760, 257/770, 765, 688; 438/688

(56) References Cited

U.S. PATENT DOCUMENTS

| | | |
|---|---|---|
| 3,577,045 A | 5/1971 | Engler et al. |
| 3,654,526 A | 4/1972 | Cunningham et al. |
| 4,080,619 A | 3/1978 | Suzuki |
| 4,253,888 A | 3/1981 | Kikuchi |
| 4,289,845 A | 9/1981 | Bowden et al. |
| 4,319,069 A | 3/1982 | Tyan |
| 4,700,465 A | 10/1987 | Sirkin |
| 4,943,539 A | 7/1990 | Wilson et al. |
| 5,176,790 A * | 1/1993 | Arleo et al. ............... 438/715 |
| 5,256,245 A | 10/1993 | Keller et al. |
| 5,269,879 A | 12/1993 | Rhoades et al. |
| 5,302,547 A | 4/1994 | Wojnarowski et al. |
| 5,368,687 A | 11/1994 | Sandhu et al. |
| 5,376,235 A | 12/1994 | Langley |
| 5,376,573 A | 12/1994 | Richart et al. |
| 5,420,076 A | 5/1995 | Lee et al. |
| 5,447,613 A | 9/1995 | Ouellet |
| 5,470,790 A | 11/1995 | Myers et al. |
| 5,486,235 A | 1/1996 | Ye et al. |
| 5,508,229 A | 4/1996 | Baker |
| 5,514,247 A | 5/1996 | Shan et al. |
| 5,563,099 A | 10/1996 | Grass |
| 5,607,543 A | 3/1997 | Eisenberg et al. |
| 5,619,071 A | 4/1997 | Myers et al. |
| 5,650,041 A | 7/1997 | Gotoh et al. |
| 5,661,083 A | 8/1997 | Chen et al. |
| 5,783,495 A | 7/1998 | Li et al. |
| 5,872,061 A | 2/1999 | Lee et al. |
| 5,883,001 A | 3/1999 | Jin et al. |
| 5,888,309 A | 3/1999 | Yuh |
| 5,970,376 A | 10/1999 | Chen |
| 6,012,469 A | 1/2000 | Li et al. |
| 6,020,254 A * | 2/2000 | Taguwa et al. ............. 438/618 |
| 6,037,664 A * | 3/2000 | Zhao et al. ................ 257/751 |
| 6,051,505 A * | 4/2000 | Chu et al. ................. 438/710 |
| 6,228,563 B1 * | 5/2001 | Starov et al. .............. 430/327 |
| 6,576,547 B2 | 6/2003 | Li |

FOREIGN PATENT DOCUMENTS

DE     002754861     7/1978

* cited by examiner

*Primary Examiner*—Eddie Lee
*Assistant Examiner*—Samuel A Gebremariam
(74) *Attorney, Agent, or Firm*—TraskBritt (57) ABSTRACT

A two-step via cleaning process which removes metal polymer and oxide polymer residues from a via with substantially no damage to the via or underlying structures on a semiconductor substrate. The via is formed through a dielectric layer and a barrier layer which are disposed over a metal-containing trace, pad, or other such circuitry, wherein the metal-containing trace, pad, or other circuitry is disposed on a semiconductor substrate. When such a via is formed, the sidewalls of the via are coated with a residue layer. The residue layer generally has a distinct oxide polymer component and a distinct metal polymer component. The two-step cleaning process comprises first subjecting the residue layer to a nitric acid dip which removes the metal polymer component to expose the oxide polymer component. The oxide polymer component is then subjected to a phosphoric acid dip which removes the oxide polymer component. The oxide polymer and metal polymer residues may also be removed during the fabrication of the via by removing them directly after their respective formations.

16 Claims, 14 Drawing Sheets

RESIDUE-FREE CONTACT OPENINGS AND METHODS FOR FABRICATING SAME

CROSS-REFERENCE TO RELATED APPLICATION

This application is a divisional of application Ser. No. 09/035,497, filed Mar. 5, 1998, now U.S. Pat. No. 6,576,547, issued Jun. 10, 2003.

BACKGROUND OF THE INVENTION

1. Field of the Invention

The present invention relates to fabricating a via employed in an integrated circuit which is substantially free of metal polymer and oxide polymer residues. More particularly, the present invention relates to a two-step via cleaning process which removes metal polymer and oxide polymer residues from a via with substantially no damage to the via or underlying structures carried on a semiconductor substrate.

2. State of the Art

Higher performance, lower cost, increased miniaturization of components, and greater packaging density of integrated circuits are ongoing goals of the computer industry. One commonly used technique in the fabrication of integrated circuits involves stacking of multiple layers of active and passive components one atop another to allow for multilevel electrical interconnection between devices formed on each of these layers. This multilevel electrical interconnection is generally achieved with a plurality of metal-filled vias ("contacts") extending through dielectric layers which separate the component layers from one another. These vias are generally formed by anisotropically etching through each dielectric layer by etching methods known in the industry, such as plasma etching and reactive ion etching. A fluorinated gas, such as $CF_4$, $CHF_3$, $C_2F_6$, $CH_2F_2$, $SF_6$, or other freons, and mixtures thereof, in combination with a carrier gas, such as Ar, He, Ne, Kr, $O_2$, or mixtures thereof, is usually used as the etching gas for these etching methods. A problem with such etching methods is that at least one layer of residue forms in the vias as a result of the etching process.

An exemplary method for forming a via through a dielectric layer is illustrated in FIGS. 11–14. It should be understood that the figures presented in conjunction with this description are not meant to be actual cross-sectional views of any particular portion of an actual semiconductor device, but are merely idealized representations which are employed to more clearly and fully depict the process of this typical method than would otherwise be possible.

Figure 11:
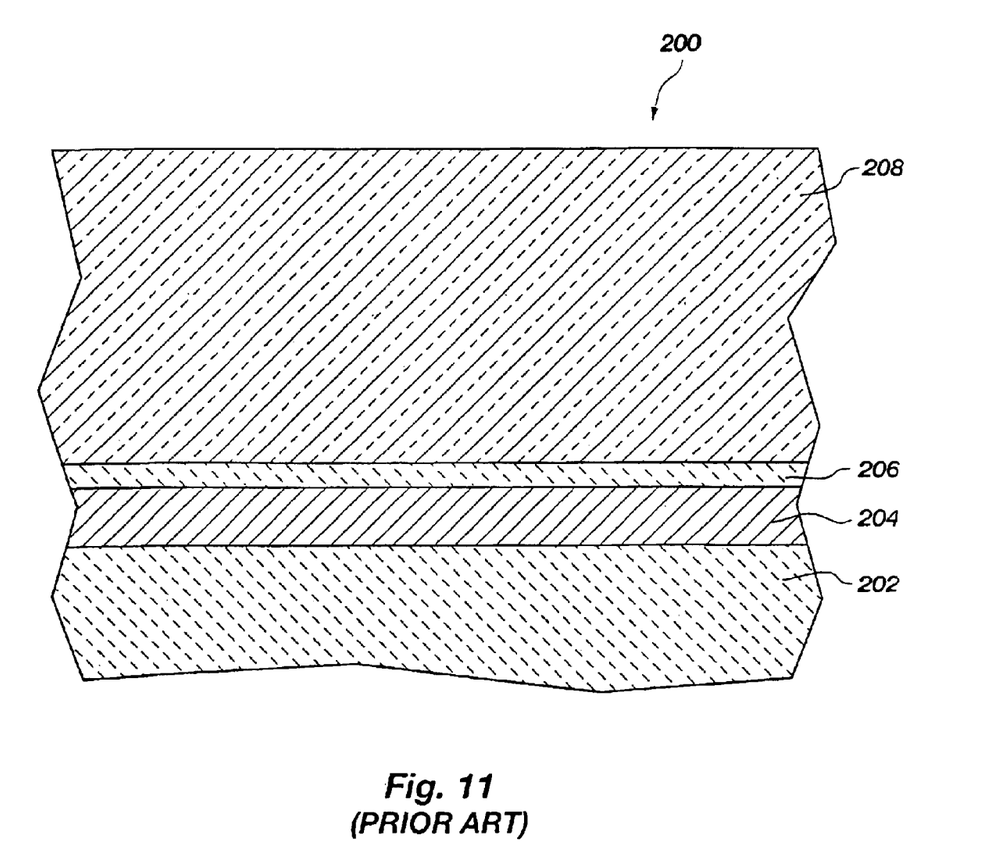
FIGS. 11–14 are prior art side cross-sectional views of a via formation process according to a known technique.
Figure 12:
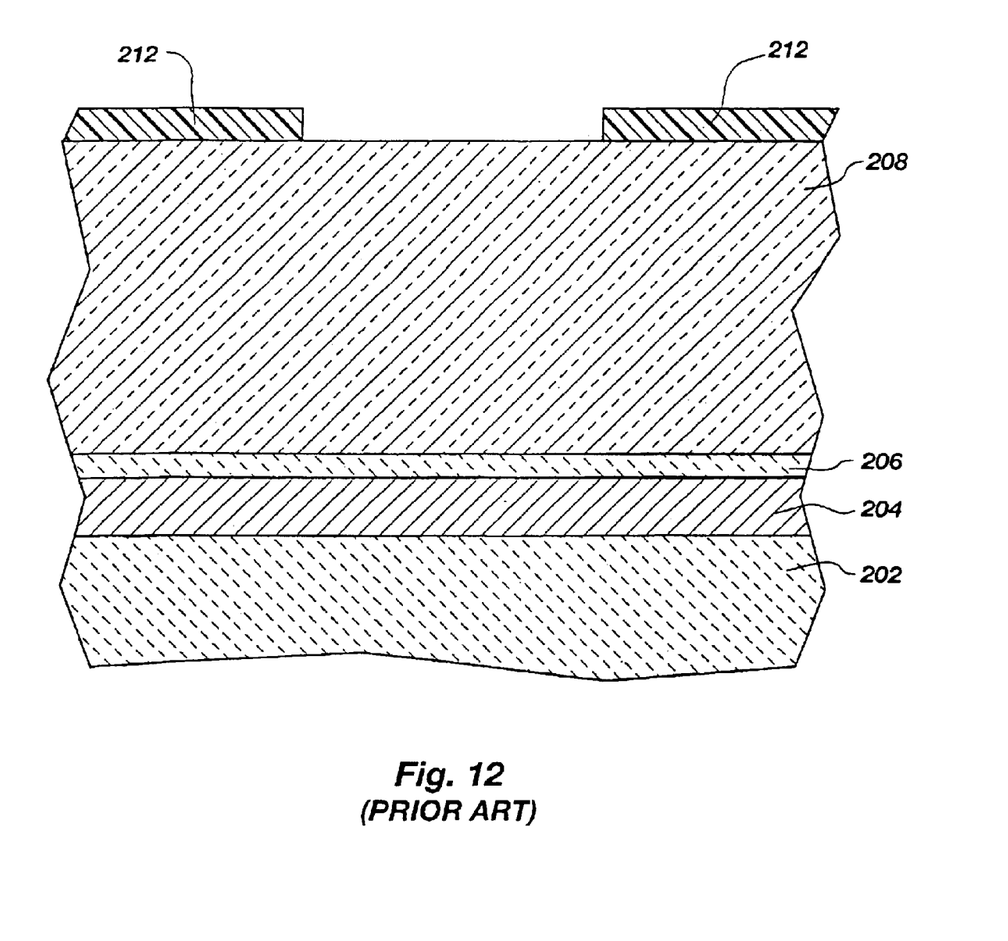
Figure 13:
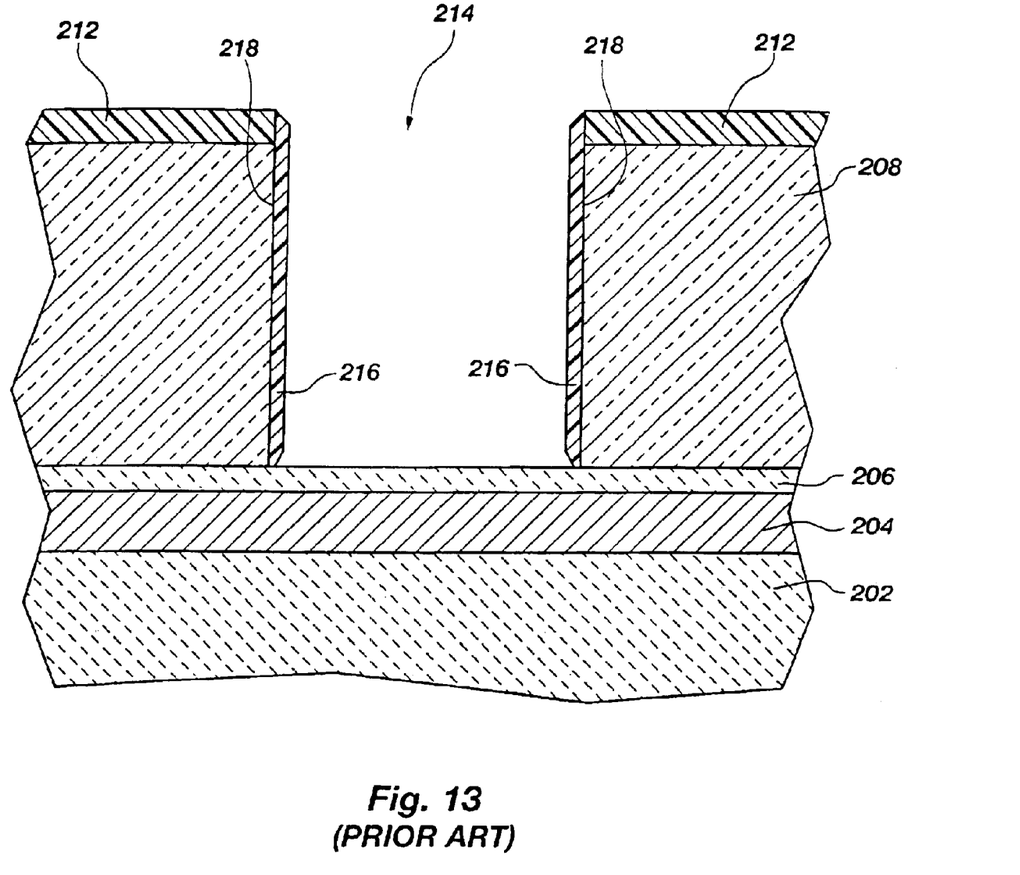
Figure 14:
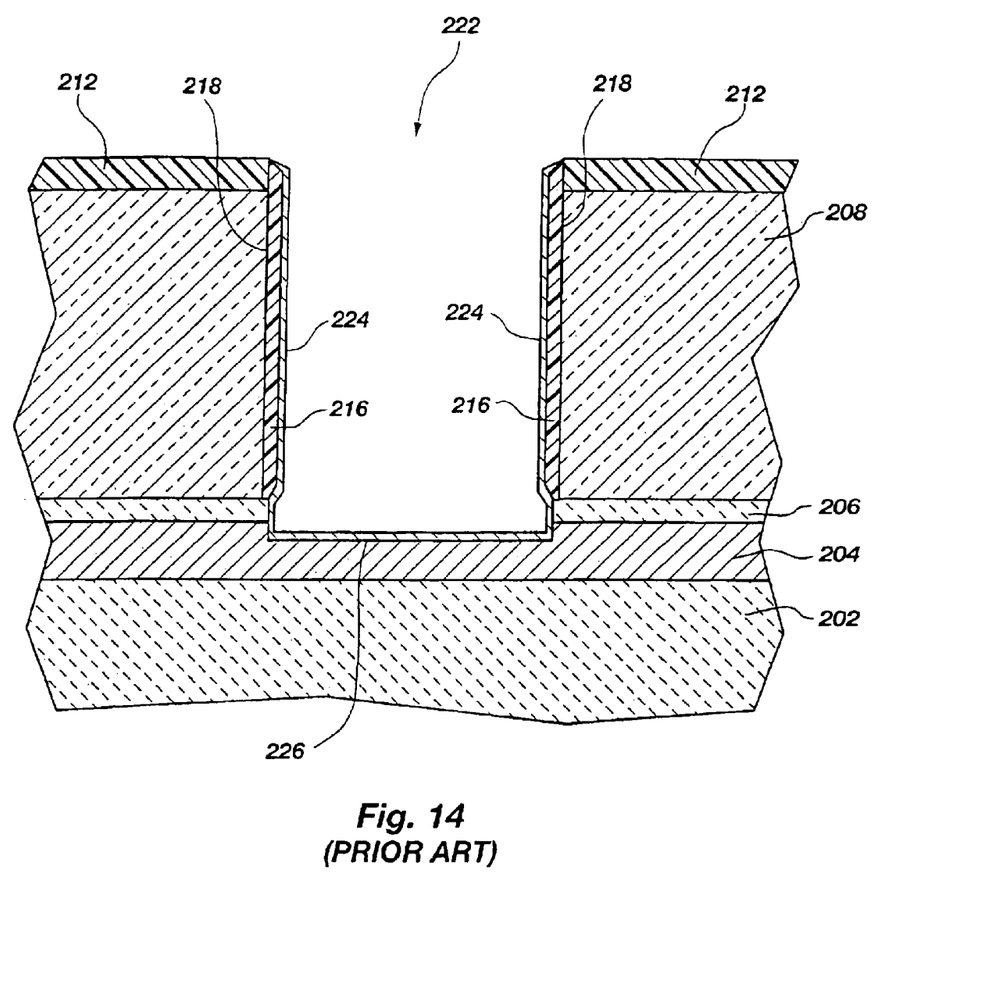

FIG. 11 illustrates an intermediate structure 200 comprising a semiconductor substrate bearing a dielectric or insulating layer 202 (such as an oxide) having a metal-containing trace or pad 204 of aluminum, aluminum alloys, titanium, titanium/tungsten alloys, molybdenum, or the like, formed thereon. The term "semiconductor substrate" is used herein to denote any solid semiconductor surface, such as is provided by a silicon or gallium arsenide wafer, or a layer of such material formed on glass, ceramic, sapphire, or other supporting carrier, as known in the art, and includes such semiconductor surfaces bearing an insulating layer thereon. A barrier layer 206 (such as titanium nitride) extends over the metal-containing trace or pad 204, and an interlayer dielectric 208 (such as silicon dioxide) is disposed over the barrier layer 206. As shown in FIG. 12, the interlayer dielectric 208 is masked with a resist material 212, which is then patterned to define a via location. A partial via 214 is then selectively etched with a fluorinated gas down to the barrier layer 206, which acts as an etch stop. The etching of the partial via 214 results in a first residue layer 216 of a carbon-fluorine based, polymer-containing residue of the interlayer dielectric 208 ("oxide polymer") coating the sidewall 218 of the partial via 214, as shown in FIG. 13. The barrier layer 206 at the bottom of partial via 214 is then etched to expose the metal-containing trace or pad 204 and form a full via 222, as shown in FIG. 14. However, due to the variation in the thickness of the interlayer dielectric 208 from the center of the wafer to the edge (usually between 4000 and 5000 Å), an oxide over-etch is applied, such that the via will usually extend through the barrier layer 206 and into the metal-containing trace or pad 204. When the barrier layer 206 and metal-containing trace or pad 204 are etched, a second residue layer 224 ("metal polymer") of a carbon-fluorine based polymer including metal etched from the metal-containing trace or pad 204, as well as any metal components in the barrier layer 206, such as the titanium in a titanium nitride barrier layer, is formed over the first residue layer 216 and the exposed surface 226 of the metal-containing trace or pad 204, also shown in FIG. 14. It is, of course, understood that a single etch could be performed to expose the metal-containing trace or pad 204, which etch would result in a single residue layer. However, even if a single etch were performed, the single residue layer would still have a portion of the residue layer adjacent the via sidewall 218 containing primarily oxide polymer and a portion adjacent the via aperture and the bottom of the via containing primarily metal polymer.

Residue layers, such as first residue layer 216 and second residue layer 224, which coat the full via, are very difficult to remove. These residue layers may be removed by dipping the structure in a 35° C. phosphoric acid solution, preferably about a 20:1 ratio (volume of water to volume of acid) solution, for about 90 seconds. Although this technique is effective in removing most of the residue layers, the residue layers are still not completely removed. The portion of the residue still remaining after the phosphoric acid dip adversely affects the conductivity of contacts subsequently formed in the full via 222. It is noted that, although extending the residence time of the semiconductor substrate structure in the phosphoric acid will effectively remove all of the residue layer(s), the increased residence time also results in damage to the metal-containing trace or pad 204.

Thus, it can be appreciated that it would be advantageous to develop a technique to clean substantially all of the residue layer(s) from a semiconductor via without substantial damage to the metal-containing trace or pad while using commercially-available, widely-practiced semiconductor device fabrication techniques.

BRIEF SUMMARY OF THE INVENTION

The present invention relates to a two-step via cleaning process which removes metal polymer and oxide polymer residues from a via in a dielectric layer with substantially no damage to the via or underlying structures. One embodiment of the present invention relates to the removal of the metal polymer and oxide polymer residues after the formation of the via. The via is formed through a dielectric layer and a barrier layer which are disposed over a metal-containing trace, pad, or other circuit element, wherein the metal-containing trace, pad, or other circuit element is disposed on a semiconductor substrate over the aforementioned oxide or other insulator. When such a via is formed, the sidewall of the via is coated with a residue layer. The residue layer generally has two distinct components: an oxide polymer layer and a metal polymer layer.

The two-step cleaning process of the present invention completely removes both components of the residue layer. The residue layer is first subjected to a nitric acid dip to remove the metal polymer layer and expose the oxide polymer layer. The oxide polymer layer is then subjected to a phosphoric acid solution dip to remove the oxide polymer layer. It has also been found that fluorine-containing mixtures, such as hydrofluoric acid (HF) and ammonium fluoride ($NH_4F$), may be used in lieu of the phosphoric acid solution or mixed with phosphoric acid for removal of the oxide polymer layer.

The oxide polymer and metal polymer layers may also be removed during the fabrication of the via, between the formation of the partial via and its extension to the underlying trace and after the full via formation, respectively. A partial via, or first via portion, is formed by masking the dielectric layer and etching through to the barrier layer (etch stop) which forms the oxide polymer residue on the walls of the partial via. The oxide polymer residue is then subjected to a phosphoric acid solution dip, which removes the oxide polymer residue. The barrier layer is then etched to extend the via in a second via portion to expose the metal-containing trace and form a full via. When the barrier layer is etched, the metal polymer layer is formed. The metal polymer layer is then subjected to a nitric acid dip which removes the metal polymer layer. Once a clean full via is achieved, a contact may be completed by, as known in the art, depositing a conductive material into the via.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

Figure 1:
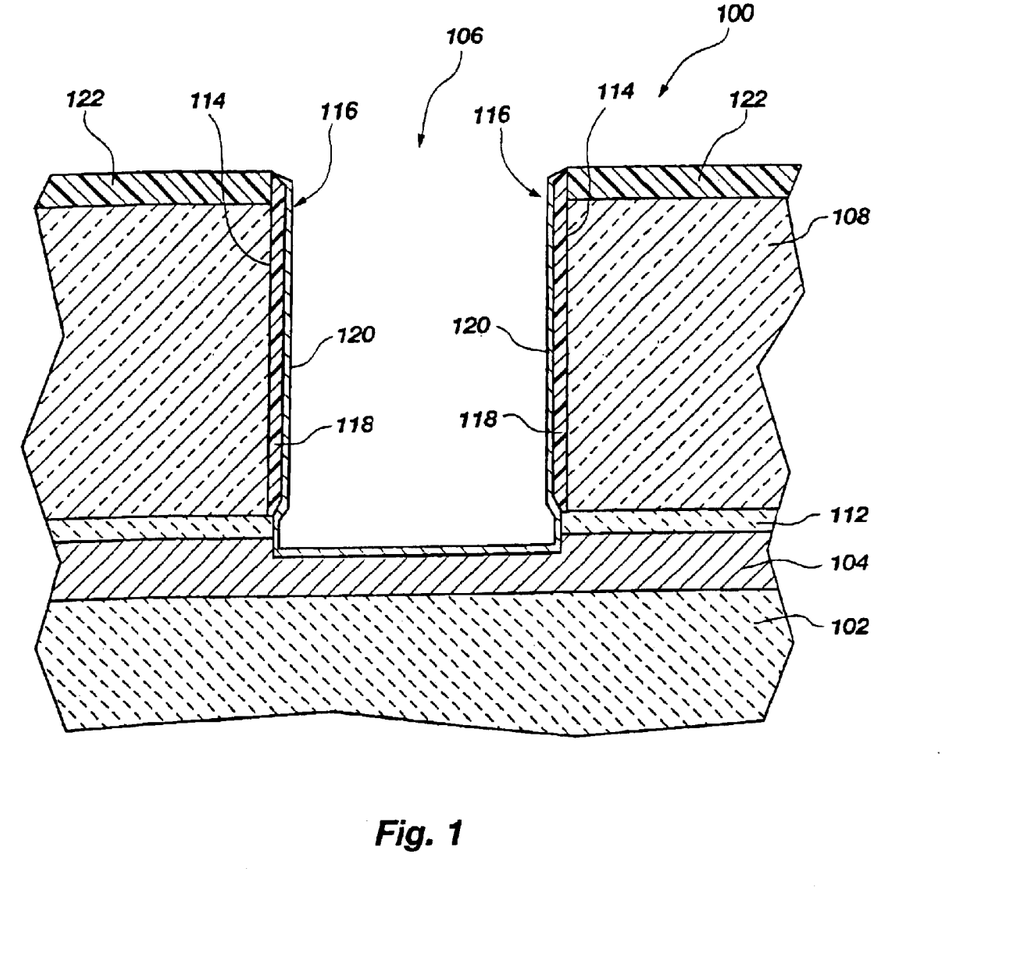
FIGS. 1–3 are side cross-sectional views of a method of removing residue material from a via according to a technique of the present invention.
Figure 2:
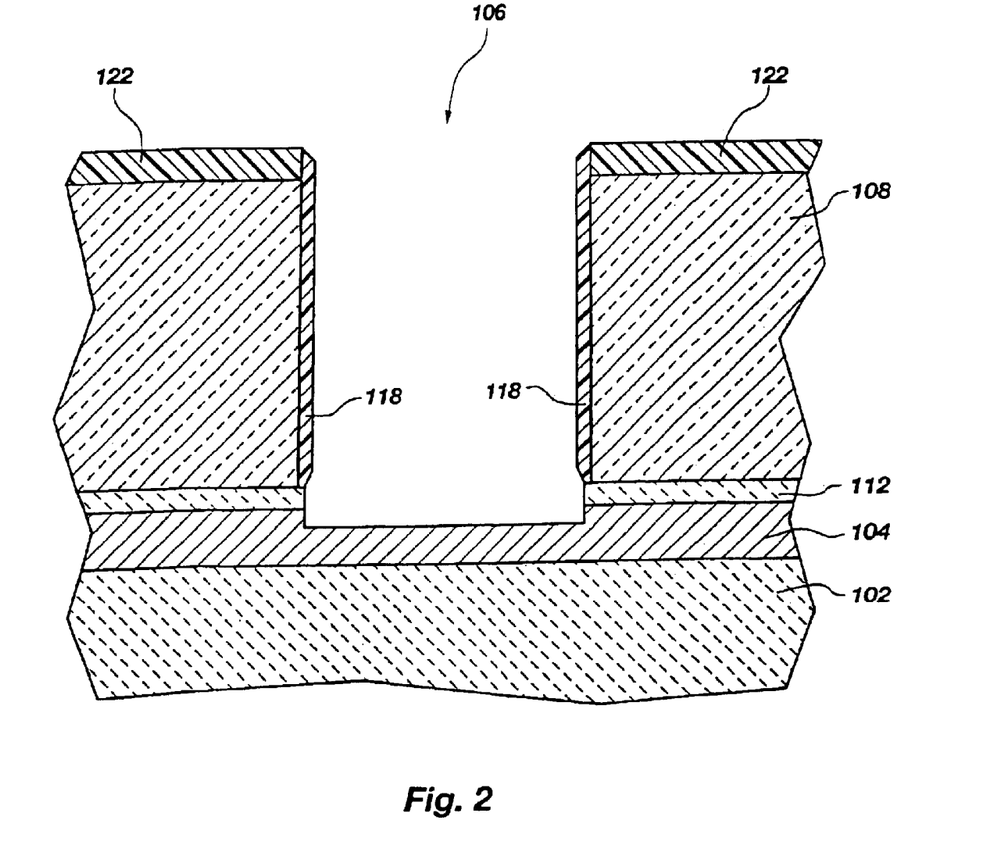
Figure 3:
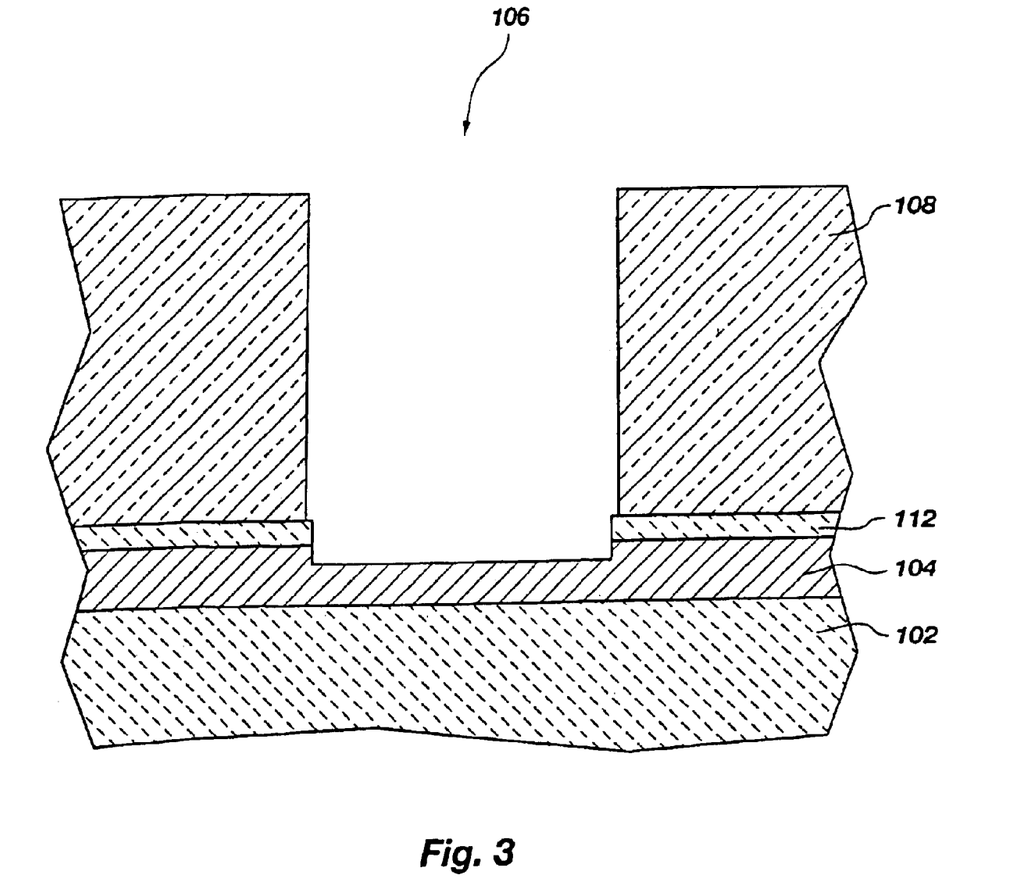

FIGS. 1–3 illustrate one embodiment according to the present invention for removing residue layers from a via. It should be understood that the figures presented in conjunction with this description are not meant to be actual cross-sectional views of any particular portion of an actual semiconductor device, but are merely idealized representations which are employed to more clearly and fully depict the process of the invention than would otherwise be possible.

FIG. 1 illustrates a via 106 in an intermediate structure 100 in the production of a semiconductor device (similar to FIG. 14) directly after the etching of the via 106. This intermediate structure 100 comprises a semiconductor substrate bearing an exposed insulating or dielectric layer 102, such as an oxide, having a metal-containing trace or pad 104 of aluminum, aluminum alloys, titanium, titanium/tungsten alloys, molybdenum, or the like, disposed thereon. The via 106 extends through a dielectric layer 108, such as silicon dioxide or the like, and a barrier layer 112, such as silicon nitride, which are disposed over the dielectric layer 102. The sidewalls 114 of the via 106 are coated with a residue layer 116. As used herein, the term "sidewall" of a via encompasses both a single, continuous sidewall, such as may define a round or circular via, as well as a plurality of sidewalls defining a via of another cross-section.

The presence of the residue layer 116 is a natural consequence of the etching of the via 106 and generally comprises two distinct layers: an oxide polymer layer 118 and a metal polymer layer 120. As previously discussed, a partial via or first via portion may be selectively etched through an etch mask 122 down through the dielectric layer 108 to the barrier layer 112 (an etch stop) which results in the oxide polymer layer 118, which is usually a carbon-fluorine based, polymer-containing residue of the dielectric layer 108, coating the sidewalls of the partial via. The barrier layer 112 may be then etched to create a second, contiguous via portion and expose the metal-containing trace or pad 104, thereby forming the via 106.

As discussed above, due to thickness variations in the dielectric layer 108, the barrier layer 112 is typically over-etched such that the etch will usually extend through the barrier layer 112 and into the metal-containing trace or pad 104. When the barrier layer 112 and underlying metal-containing trace or pad 104 are etched, a metal polymer layer 120 is formed atop the oxide polymer layer 118. The metal polymer layer 120 usually comprises a carbon-fluorine based polymer including metal etched from the metal-containing trace or pad 104, as well as any metal components in the barrier layer 112, such as the titanium in a titanium nitride barrier layer 112. Again, as previously discussed, a single etch could be performed to penetrate dielectric layer 108 and barrier layer 112 and expose the metal-containing trace or pad 104 which would result in a single residue layer. However, the single residue layer would still have an inner portion of the residue layer adjacent the via sidewall 114 containing primarily an oxide polymer and a outer portion adjacent the via 106 containing primarily a metal polymer.

It has been found by the inventors that a concentrated nitric acid is effective in removing the metal polymer layer 120 portion of the residue layer 116, and phosphoric acid is effective in removing the oxide polymer layer 118 portion of the residue layer 116. However, it has been found by the inventors that it was not possible to completely remove all of the residue layer 116 by either phosphoric acid application or nitric acid application alone. It was further found by the inventors that attempts to completely remove the residue layer 116 by increasing the residence time in the phosphoric acid results in damage to the barrier layer 112 and/or the metalcontaining trace or pad 104. Furthermore, mixtures of phosphoric acid and nitric acid were also found to be unacceptable for removal of the residue layer 116.

Thus, a two-step cleaning process may be used to substantially remove the entire residue layer 116. The residue layer 116 is first subjected to a nitric acid dip for about 200 seconds to remove the metal polymer layer 120 and expose the oxide polymer layer 118, as shown in FIG. 2. The nitric acid dip may preferably contain between about 50% and 100% by weight nitric acid, most preferably about 70% by weight, and preferably have a temperature of between about 10° C. and 100° C., most preferably about 25° C. The duration of the nitric acid dip is preferably between about 10 seconds and 30 minutes, most preferably 200 seconds. However, the duration of the nitric acid dip will depend on the concentration and temperature of the nitric acid dip.

The oxide polymer layer 118 is then subjected to a 35° C. phosphoric acid solution dip, preferably about a 20:1 ratio (volume of water to volume of acid) solution, for about 90 seconds, which removes the oxide polymer layer 118, as shown in FIG. 3, after the etch mask 122 has been removed. The phosphoric acid solution dip may be in a concentration between about 200:1 and 1:1 volumetric ratio of water to acid at a temperature of between about 10° and 80° C. The duration of the phosphoric acid solution dip is preferably between about 10 seconds and 10 minutes. However, the duration of the phosphoric acid dip will depend on the concentration and temperature of the dip.

In an experiment employing the aforementioned, nitric acid and phosphoric acid dips were used to clean vias of depths ranging from 0.4 to 0.7 microns and having diameters ranging from 0.4 to 1 micron and exhibiting metal polymer layers of approximately 200 Å in thickness and oxide polymer layers of approximately 300 Å in thickness. A nitric acid dip was used at about 70% by weight nitric acid, at about ambient room temperature and for a duration of about 200 seconds. A subsequent phosphoric acid dip at about a 20:1 ratio acid to water volume was employed at about 35° C. for about 90 seconds. No detectable metal polymer or oxide polymer remained in the vias after treatment. Thus, a nitric acid dip of about 100 seconds was demonstrated to remove about 100 Å in thickness of oxide polymer.

It has also been found that the oxide polymer layer 118 can be removed by subjecting the oxide polymer layer 118 to a dip in fluorine containing mixtures; for example, components such as hydrofluoric acid (HF) and ammonium fluoride ($NH_4F$) may be used in lieu of the phosphoric acid solution or mixed with phosphoric acid for removal of the oxide polymer layer. A preferred concentration for such fluorine-containing mixtures may range from about 0.01% to about 2%.

Figure 4:
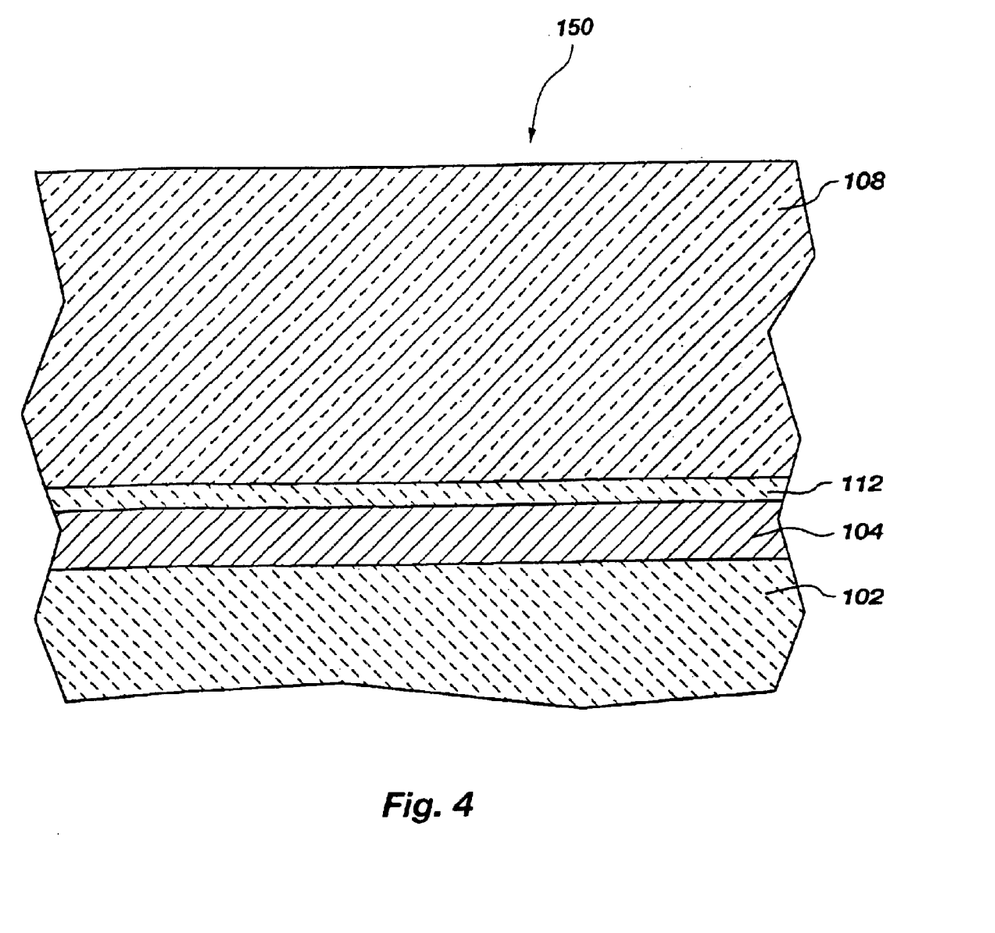
FIGS. 4–9 are side cross-sectional views of a method of removing residue material while forming a via according to another technique of the present invention.
Figure 5:
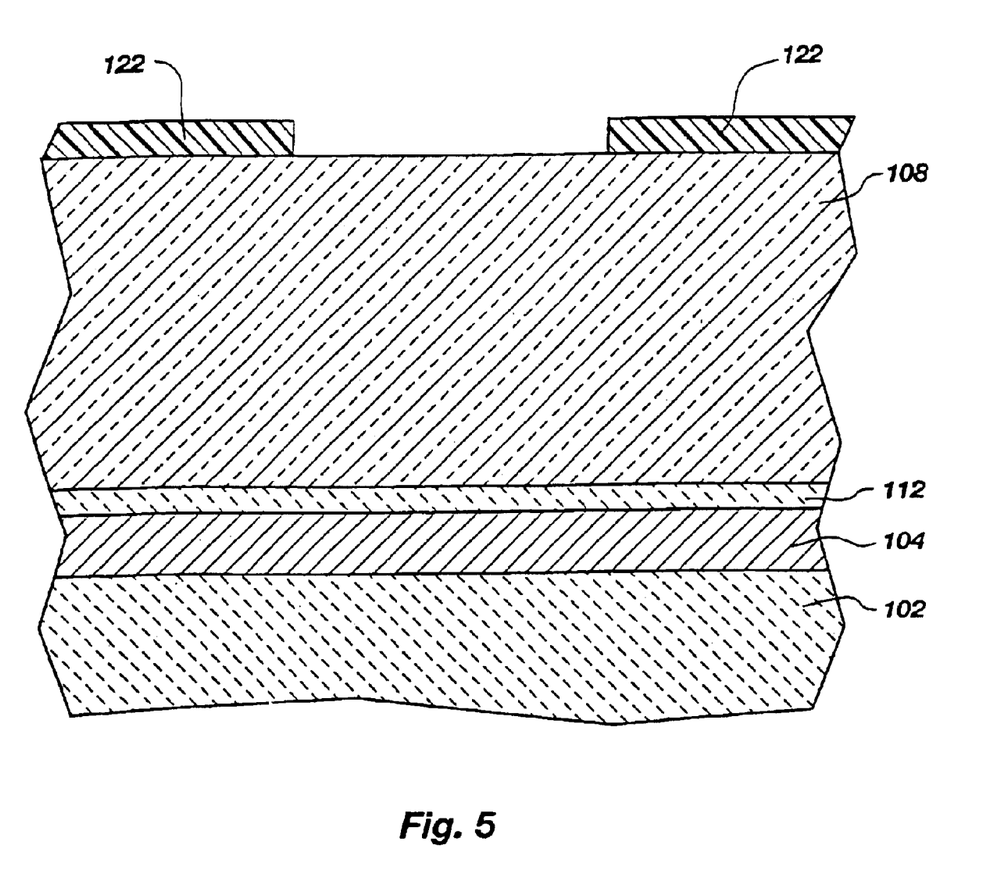
Figure 6:
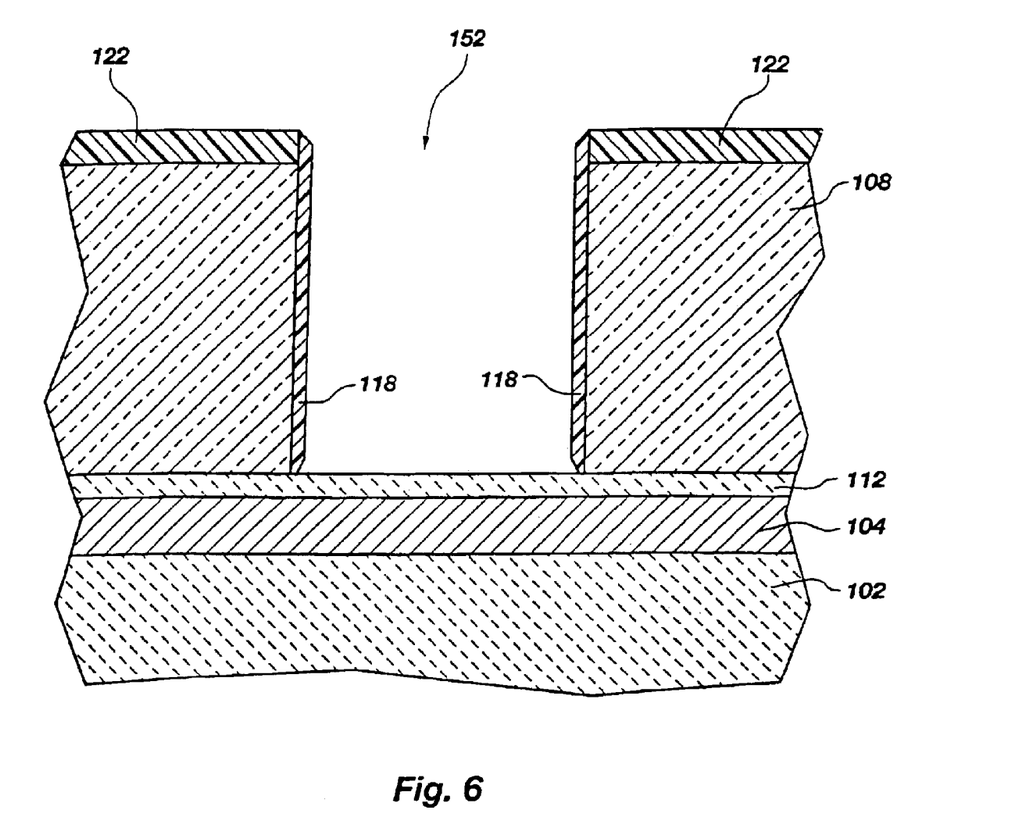
Figure 7:
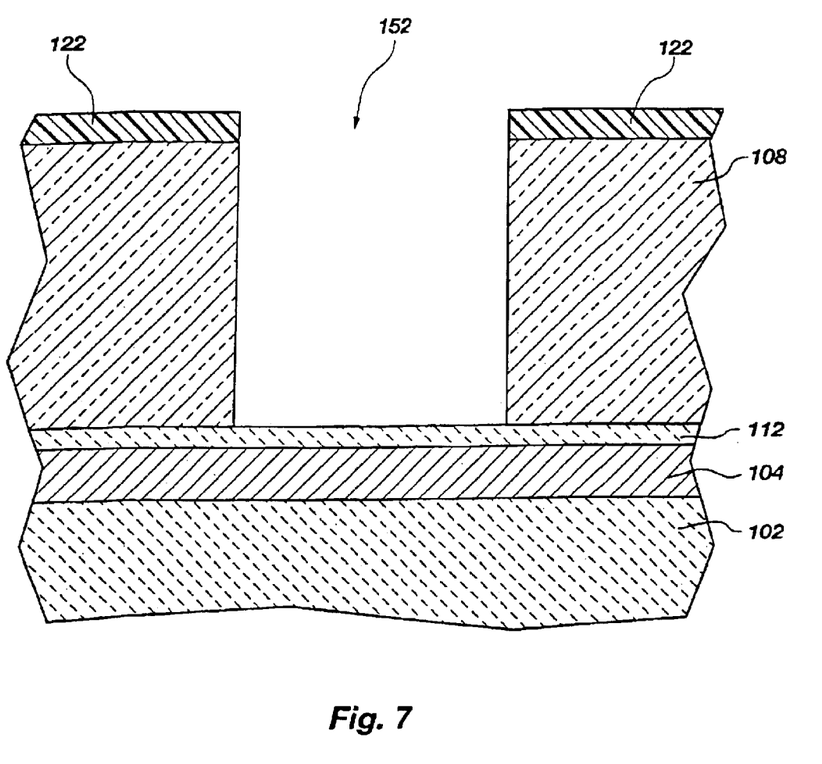

As illustrated in FIGS. 4–9, the two-step process may also be effected during the formation of a via. Elements common between FIGS. 1–3 and 4–9 retain the same numeric designation. FIG. 4 illustrates an intermediate structure 150 comprising a semiconductor substrate bearing a dielectric layer 102 having a metal-containing trace or pad 104 formed thereon. A barrier layer 112, such as silicon nitride, extends over the metal-containing trace or pad 104 and a dielectric layer 108, such as silicon dioxide, is disposed over the barrier layer 112. As shown in FIG. 5, the dielectric layer 108 is masked with an etch mask 122, which is patterned to define the via location. A partial via or first via portion 152 is then selectively etched down to the barrier layer 112 (an etch stop) which results in the oxide polymer layer 118, which is usually a carbon-fluorine based, polymer-containing residue of the dielectric layer 108, coating the sidewalls of the partial via 152, as shown in FIG. 6. The oxide polymer layer 118 is then subjected to a phosphoric acid solution dip, preferably about a 20:1 volume ratio of water to phosphoric acid at about 35° C. for about 90 seconds, to remove the oxide polymer layer 118, as shown in FIG. 7.

Figure 8:
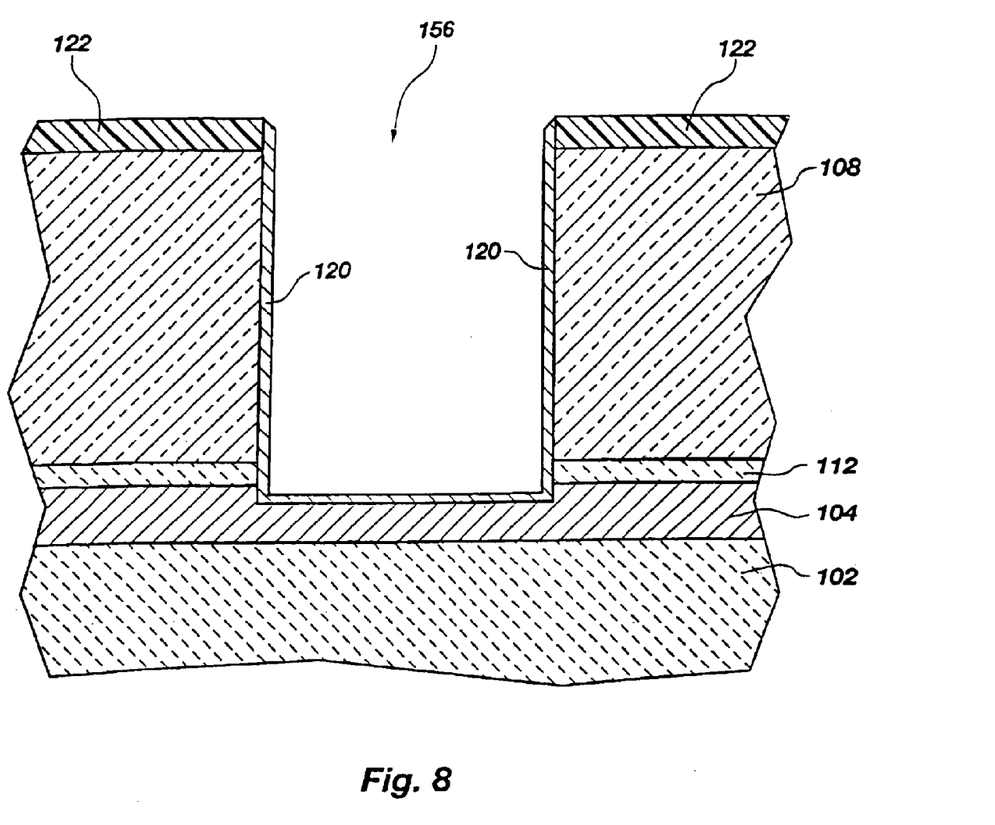
Figure 9:
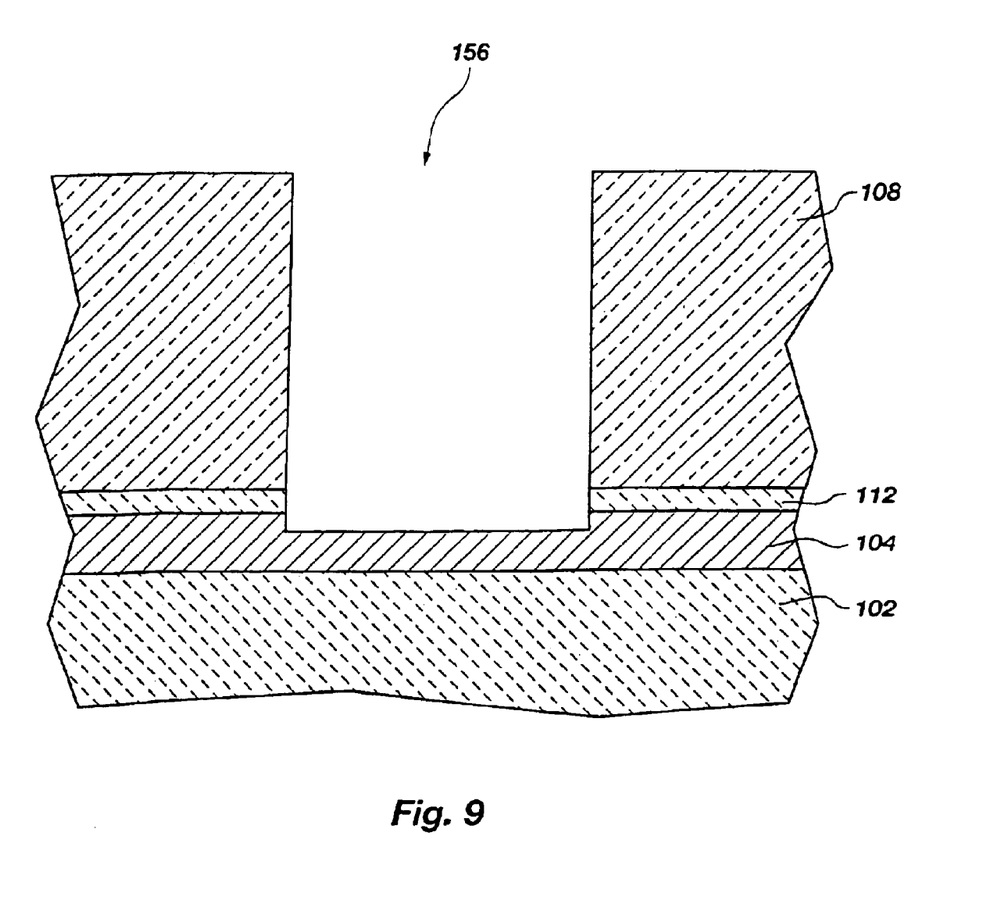

The barrier layer 112 is then etched to form a second via portion and expose the metal-containing trace or pad 104, thereby forming a full via 156, as shown in FIG. 8. When the barrier layer 112 is etched, as discussed above, a metal polymer layer 120 is formed which is usually a carbon-fluorine based polymer including metal etched from the metal-containing trace or pad 104, as well as any metal components in the barrier layer 112. The metal polymer layer 120 is then subjected to a nitric acid dip, preferably approximately 70% volume nitric acid for about 200 seconds, which removes the metal polymer layer 120, as shown in FIG. 9, after the etch mask 122 has been removed.

Figure 10:
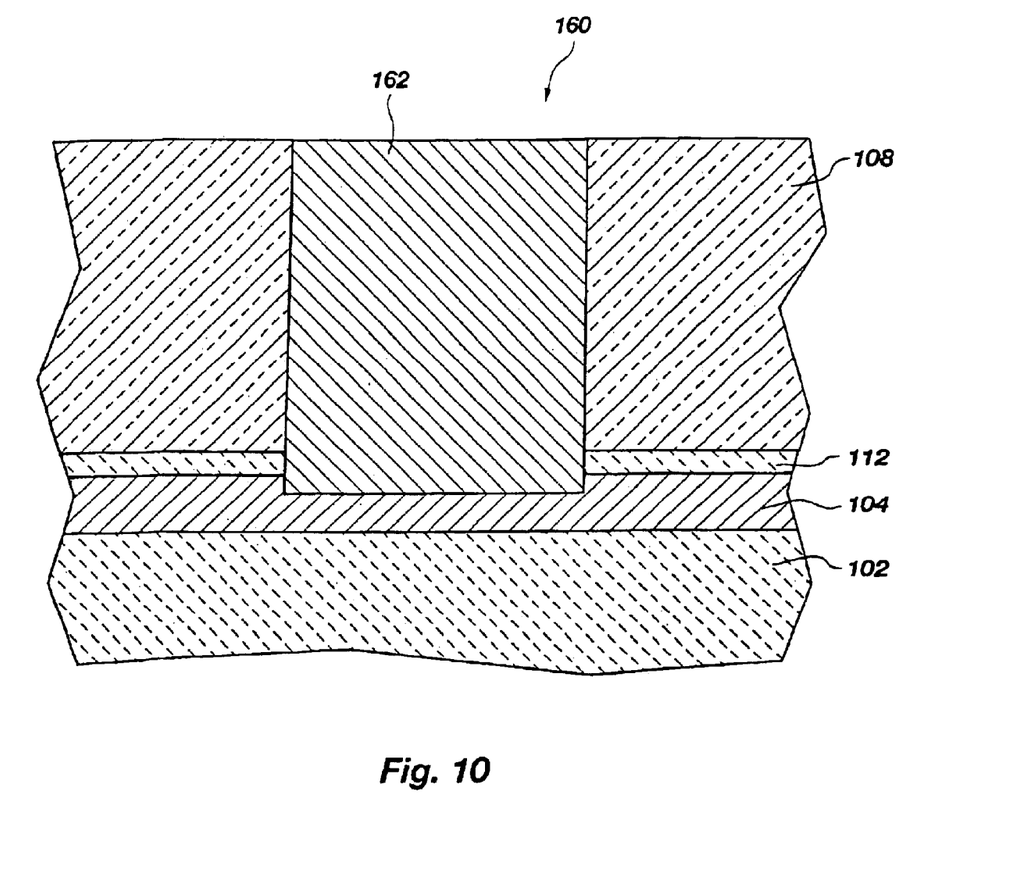
FIG. 10 is a side cross-sectional view of a contact formed according to a technique of the present invention.

Once a clean via is achieved, a contact 160 may be completed by depositing a conductive material 162 into the via, as shown in FIG. 10. The conductive material 162 is preferably a metal, including but not limited to copper, silver, gold, aluminum (preferred), and alloys thereof. However, conductive polymers may be used. The deposition of the conductive material 162 may be effected by methods including, but not limited to, hot sputter/reflow, ionized plasma, hot pressure fill, as well as physical vapor deposition and chemical vapor deposition combinations.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. A contact opening in a first dielectric layer for a semiconductor device, comprising:

a semiconductor substrate carrying a metal-containing conductive pad and a metal barrier layer overlying said metal-containing conductive pad;

said first dielectric layer extending over said semiconductor substrate in a vicinity of said metal-containing conductive pad; and at least one residue-free opening having substantially parallel sidewalls and extending through said first dielectric layer from an upper surface of said first dielectric layer through said metal barrier layer to said metal-containing conductive pad.

2. A contact structure for a semiconductor device, comprising:

a semiconductor substrate carrying a metal-containing conductive pad and a metal barrier layer overlying said metal-containing conductive pad;

a first dielectric layer extending over said semiconductor substrate in a vicinity of said metal-containing conductive pad;

at least one residue-free opening having substantially parallel sidewalls and extending through said first dielectric layer from an upper surface of said first dielectric layer to said metal-containing conductive pad; and a conductive material disposed within said at least one residue-free opening.

3. The contact opening of claim 1, further comprising a second dielectric layer underlying said metal-containing conductive pad.

4. The contact opening of claim 3, wherein said second dielectric layer has a thickness of approximately 300 Å.

5. The contact opening of claim 1, wherein said metal-containing conductive pad is selected from the group consisting of aluminum, aluminum alloy, titanium, titanium/tungsten alloys and molybdenum.

6. The contact opening of claim 1, wherein said first dielectric layer comprises silicon dioxide.

7. The contact opening of claim 1, wherein said at least one residue-free opening has a depth of about 0.4 to 0.7 microns.

8. The contact opening of claim 1, wherein said at least one residue-free opening has a diameter of about 0.4 to 1 micron.

9. The contact opening of claim 1, wherein said metal-containing conductive pad has a thickness of approximately 200 Å.

10. The contact structure of claim 2, further comprising a second dielectric layer underlying said metal-containing conductive pad.

11. The contact structure of claim 10, wherein said second dielectric layer has a thickness of approximately 300 Å.

12. The contact structure of claim 2, wherein said metal-containing conductive pad is selected from the group consisting of aluminum, aluminum alloy, titanium, titanium/tungsten alloys and molybdenum.

13. The contact structure of claim 2, wherein said first dielectric layer comprises silicon dioxide.

14. The contact structure of claim 2, wherein said at least one residue-free opening has a depth of about 0.4 to 0.7 microns.

15. The contact structure of claim 2, wherein said at least one residue-free opening has a diameter of about 0.4 to 1 micron.

16. The contact structure of claim 2, wherein said metal-containing conductive pad has a thickness of approximately 200 Å.

* * * * *